United States Patent [19]

Charsky et al.

[11] 4,172,664
[45] Oct. 30, 1979

[54] HIGH PRECISION PATTERN REGISTRATION AND OVERLAY MEASUREMENT SYSTEM AND PROCESS

[75] Inventors: Ronald S. Charsky, Binghamton; Alexander L. Flamholz, Monsey, both of N.Y.

[73] Assignee: International Business Machines Corporation, Armonk, N.Y.

[21] Appl. No.: 865,807

[22] Filed: Dec. 30, 1977

[51] Int. Cl.² .............................................. G02B 9/00
[52] U.S. Cl. .................................... 356/356; 356/363; 356/400
[58] Field of Search ............... 356/374, 399, 400, 401, 356/355, 356, 354, 363; 350/272

[56] References Cited

U.S. PATENT DOCUMENTS

| | | | |
|---|---|---|---|
| 3,565,532 | 2/1971 | Heitmann | 356/400 |
| 3,751,170 | 8/1973 | Hidaka | 356/172 |
| 3,796,497 | 3/1974 | Mathisen | 356/152 |
| 3,797,939 | 3/1974 | Pryor | 356/111 |
| 3,883,249 | 5/1975 | Pryor | 356/111 |
| 3,957,376 | 5/1976 | Charsky | 356/106 R |

OTHER PUBLICATIONS

Barshay, M. et al., "Width and Overlay Measuring Algorithm", IBM Tech. Disclosure Bulletin, vol. 19, No. 11, Apr. 1977, p. 4203.

*Primary Examiner*—Conrad J. Clark
*Attorney, Agent, or Firm*—David M. Bunnell

[57] ABSTRACT

A system for measuring the lateral displacement between edges located on two spaced apart objects, with a precision in the order of 1 microinch, generates and analyses the diffraction pattern produced by the physical edge on one object and the aerial image of the edge on the other object. The system can be used for the alignment of the objects or the comparison of patterns located on the objects.

13 Claims, 8 Drawing Figures

HIGH PRECISION PATTERN REGISTRATION AND OVERLAY MEASUREMENT SYSTEM AND PROCESS

BACKGROUND OF THE INVENTION

There is a need in modern manufacturing processes to measure the lateral displacement of two objects, or of features on the objects, automatically and with great precision where the objects are in separate planes and can't be conveniently placed in the same or adjacent planes. For example, in integrated circuit manufacture, it is necessary to align the patterns on a projection exposure mask with existing patterns on a radiation sensitive resist coated semiconductor wafer so that correct overlay of the patterns will occur when the resist is exposed. Also, it is necessary to check sets of exposure masks prior to use to assure that the patterns on different masks overlay one another within acceptable tolerances.

The integrated circuit device density is constantly being increased to permit more circuits to be formed in a given area of semiconductor. This requires that the positioning and measurement be accurate to smaller and smaller dimensions. In the case of mask and wafer alignment for projection printing, it is customary to provide corresponding alignment targets on the mask and wafer. In the past, the targets have been manually superimposed by an operator. This is a slow process and the alignments suffer from operator fatigue and error. Electro optical alignment systems have been devised to provide automatic alignment but these have not replaced operator alignment. One reason is the fact that, because of target quality and the number of layers of material which may overlay a target, the alignment signals do not permit successful alignment a sufficient percent of the time to achieve the degree of reliability needed for a production line.

U.S. Pat. No. 3,957,376 discloses a measuring method and system for measuring the dimensional characteristics of line edges or boundaries of patterns on a semiconductor wafer using a diffraction pattern which is produced by two parallel, physical edges which are located in the same or substantially the same plane.

Where two objects are involved, it may not be possible to locate the edges in the same plane. U.S. Pat. Nos. 3,797,939; 3,883,249 and 3,884,581 disclose the determination of boundary positions by interference pattern analysis where the boundaries can be in different planes along the path of the light and in which the interference waves are produced by the physical boundaries. In the case of mask and wafer alignment one of the boundaries is located on an opaque surface so that a useful interference pattern cannot be produced by this means.

We have now found a system and method which provides for measuring the lateral displacement of edges located in different planes to a precision in the order of 1 microinch using a diffraction pattern produced by the physical edge in one plane and the aerial image of the other edge located in the plane of the physical edge. Surprisingly, this diffraction pattern provides a precision comparable to that produced by two physical edges in the same plane. The signal to noise ratio is high and provides useful signals where usually low contrast alignment targets are involved and/or where the alignment targets are covered by overlying layers.

BRIEF SUMMARY OF THE INVENTION

In accordance with this invention a system and method for measuring the lateral displacement between edges located on two spaced apart objects are provided. The system has means to illuminate the edges with collimated, monochromatic, spatially coherent radiation and means to form the focussed aerial image of a first edge which is located on one of the objects at the plane of a second edge which is located on the other of the objects so as to produce a diffraction pattern from the interference of the second edge and the aerial image of the first edge. A means is provided to image the diffraction pattern to a sensor which detects the light intensity at different points in the pattern such that the locations of diffraction pattern minima can be determined and a means for determining the lateral displacement between the edges from the distance between the diffraction pattern minima as located by the sensor.

Also provided are a system and method for aligning first and second objects with respect to one another. The system includes two spaced apart corresponding alignment targets on each object with each target including at least one edge in the X and one edge in the Y orthogonal directions. A means is provided for placing and holding the first and second objects in approximate alignment with the means including indexing means for changing the relative position of the two objects in the X, Y and angular ($\theta$) directions. The system includes means to illuminate the targets with collimated monochromatic spatially coherent radiation means to form the focussed aerial image of the targets on the first of the objects at the plane of the targets on the second of the objects, and means to produce diffraction patterns from the interference between corresponding edges of the targets on the first object and the aerial edges of the targets on the second object. A means is provided to image the diffraction patterns to sensor means which detect the light intensity at different points in the patterns such that the location of the diffraction pattern minima can be determined. A control means is provided for computing the lateral displacements between corresponding edges of the targets on the first and second objects from the diffraction pattern minima and for computing the relative positions of the two objects from the lateral displacements and to cause the indexing means to move the two objects into alignment with respect to one another.

DETAILED DESCRIPTION

Figure 1:
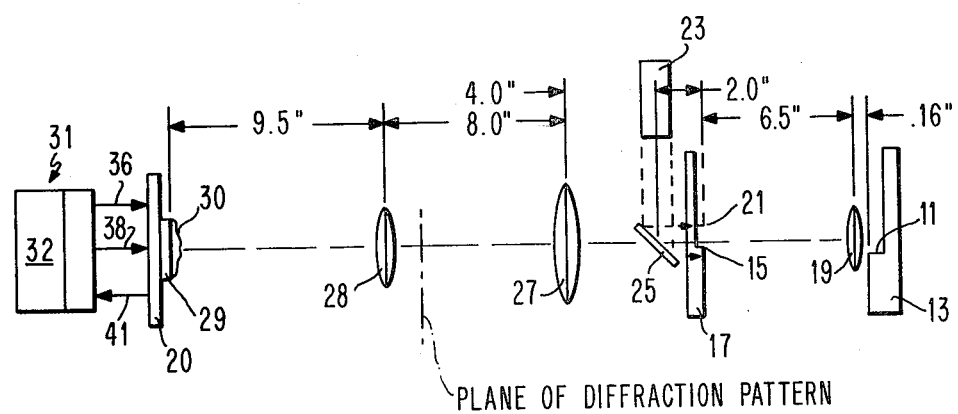
FIG. 1 is a schematic diagram illustrating an embodiment of the system of the invention.
Figure 2:
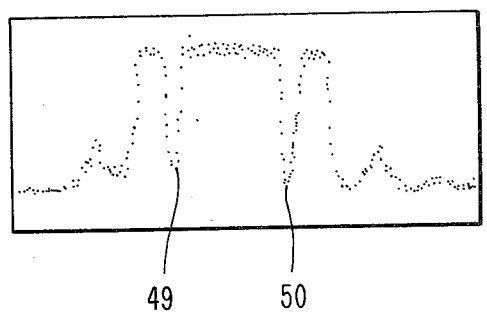
FIG. 2 is a drawing illustrating a diffraction pattern obtained on a CRT scope using the system illustrated in FIG. 1.

Turning now to FIG. 1 a system for measuring the lateral displacement of an edge 11 on a first opaque object 13 such as a semiconductor wafer and an edge 15 on a second object 17 such as a chrome on glass pattern mask is schematically shown with the edge dimensions being exaggerated for the purpose of illustration. Objects 13 and 17 are held in separate parallel planes with projection lens 19 (for example a 32×/0.60 Leitz lens) forming the aerial image 21 of edge 11 at the plane of object 17 when the edges are illuminated by a light source 23 of collimated, monochromatic, spatially coherent light for example from a helium-neon laser (5 mw) which is directed by beam splitter 25 to the edges. The edges 11 and 15 are lines which are "substantially parallel" which as used in the claims include the edges of a line, the edge of a square or a rectangle, and the parallel tangent line edges of a circle or an ellipse. Lenses 27 (for example, a f 105 mm NIKKOR-P) and 28 (for example, a 3.2×/0.12 Leitz) image diffraction pattern 30, which is produced by the interference between the diffracted light rays from edge 15 and the diffracted light rays from the aerial image 21 of edge 11, to a sensor 20 having a diode array 29, a suitable example of a sensor being the solid state line scanner solid by Reticon Corporation as Model RL-256DA which has 256 silicon photodiodes mounted on 1 mil centers. The structure and operation of the Reticon line scanner is described in U.S. Pat. No. 3,957,376, entitled "Measuring Method and System Using A Diffraction Pattern" issued May 18, 1976 whose teachings are hereby incorporated by reference, (see FIG. 2 of patent) and will not be repeated here. FIG. 2 is a drawing illustrating a diffraction pattern obtained on a CRT scope using the system illustrated in FIG. 1. A computing and control means 31 provides a start signal through line 38 and clock signals through line 36 and receives the output of the diode array 29 through video line 41. The structure and operation of suitable control means 31 for obtaining and processing the signals from the diode array and the method of determining the edge separation is described in detail in U.S. Pat. No. 3,957,376. The control means includes a computer 32, such as an IBM 360/30 computer, which determines the locations of adjacent zero intensity positions of the diffraction pattern and the lateral displacement between the line edges is obtained by using the formula:

distance between line edges =
$$\frac{2 \times \text{(wavelength of light)} \times \text{(effective focal length)} \times \text{(specific minima number)}}{\text{distance between symmetric zero positions.}}$$

In the foregoing formula, the "specific minima number" is determined by which of the symmetrical zero intensity positions are used.

Thus, the specific minima number is one if the zero intensity positions 49 and 50 of FIG. 2 are used. If the next adjacent zero intensity positions are used, then the specific minima number is two.

The system of the invention has many applications and can be used, as hereinafter described, to align objects by determining the lateral displacement of corresponding line edges on each object and then moving the objects with respect to one another until the lateral displacement corresponds to a value indicating that the two objects are aligned, for example, the alignment of a exposure mask pattern to preexisting patterns on a semiconductor wafer. Also, the lateral displacement of features on two objects can be determined for example, in the overlay comparison of patterns on different masks of a set used to produce integrated circuits.

Figure 3:
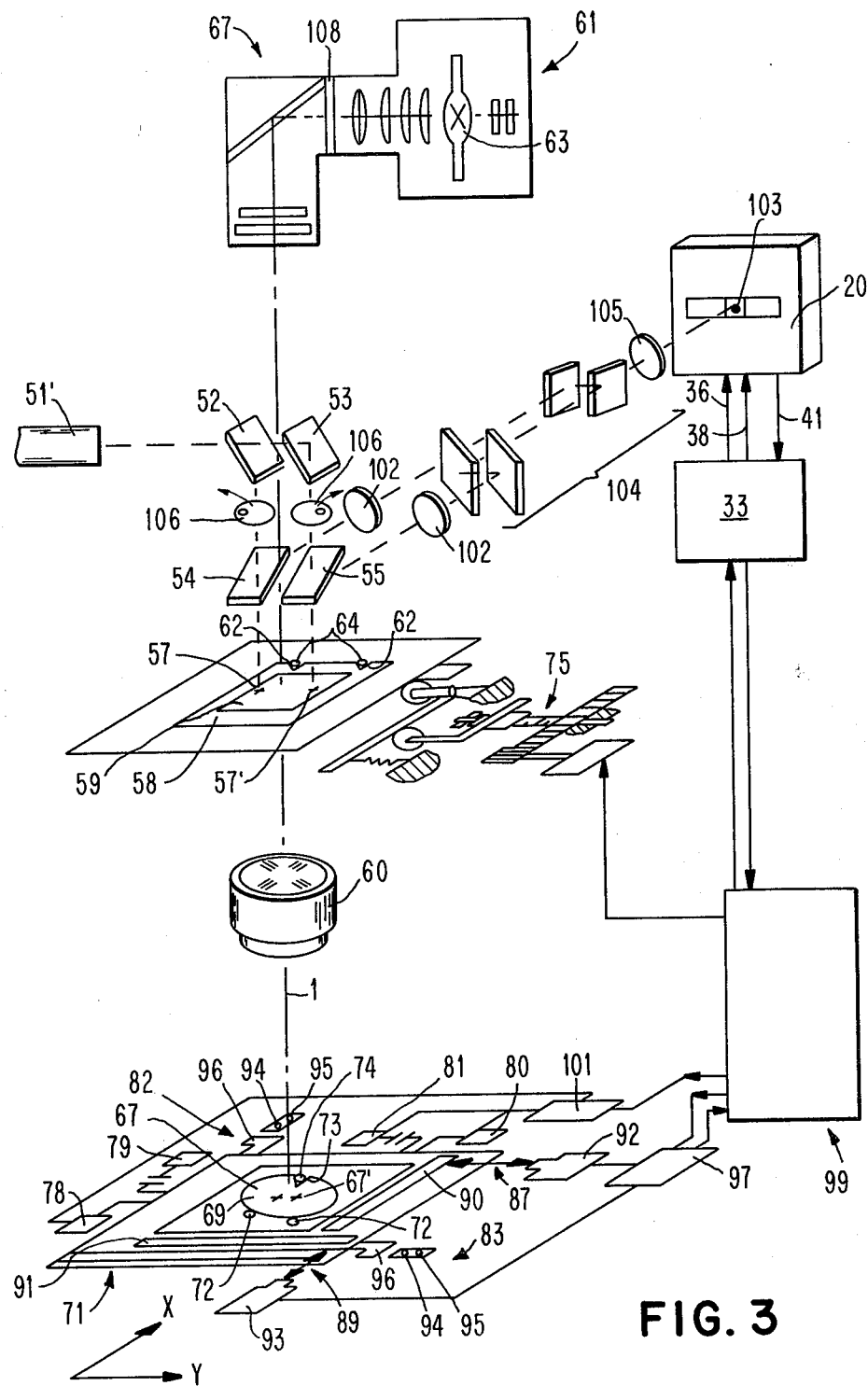
FIG. 3 is a schematic diagram of an over-all system for aligning exposure masks and wafer patterns for resist exposure.
Figure 4A:
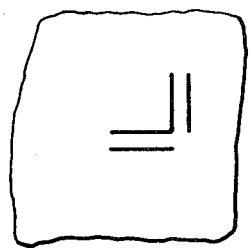
FIG. 4a and 4b illustrate an example of suitable corresponding alignment target patterns for a mask and wafer.
Figure 4B:
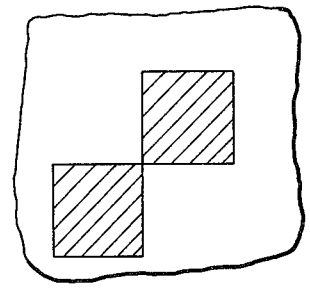

Turning now to FIG. 3 a system for aligning a pattern mask with patterns on a radiation sensitive resist coated semiconductor wafer is illustrated. Light source 51 supplies collimated, monochromatic, spatially coherent light to beam splitter 52 and mirror 53. Light source 51 is, for example, a helium cadmium 15 mw laser such as a Spectraphysics Model laser. A helium cadmium light source is selected to be compatible with projection printing lens 60 which is corrected in blue and violet to expose photoresist. This avoids the necessity of using a correction lens when doing either the alignment using the laser light or the photoresist exposure using light source 61. Light source 61 includes a mercury light 63 and condenser lens and mirror structure 67. Light reflected from beam splitter 52 and mirror 53 passes respectively through beam splitters 54 and 55 to illuminate, with a 0.16 mm. diameter light spot, alignment targets 57 and 57' on mask 59 and corresponding targets 67 and 67' on resist coated wafer 69 which is supported on X-Y table 71. Shutters 106 are provided so that the left and right hand side alignment targets can be alternately illuminated. Mask 59 is positioned in frame 58 which has notches 62 which are positioned against pin 64. Wafer 69 is held in proper orientation on table 71 by fingers 72 which hold wafer notch 73 against pin 74. A mask rotating system 75 is provided to rotate the mask so that its angular position with respect to the wafer 69 can be adjusted by rotation about an axis (not shown). The axis could be within or to the side of the mask. The axis of rotation is set in the embodiment shown to pass through the center of the mask on a line forming the centers of the two targets. X-Y table 71 is arranged to be driven in X and Y orthogonal directions by stepping motors 78, 79, 80 and 81. A pair of motors, one for the coarse and one for the fine positioning of table 71, being provided for each direction. Table 71 has reference position sensors 82 and 83 for the X and Y directions respectively, for bringing the table center to a (0,0) coordinate reference position in line with the optical axis 1. Sensors 82 and 83 each include a pair of electric eyes 94 and 95 which are mounted in tandum. Blades 96 are mounted to extend from the sides of Table 71 in line with the electric eyes and are of a width such that they block both light beams of the electric eye simultaneously only when the table is in the correct X or Y reference position. Laser interferometers 87 and 89 are provided to measure the movement and thereby the position of Table 71 in the X and Y directions as is known in the art and include a pair of roof prisms 90 and 91 mounted on Table 71 with associated lasers 92 and 93. The laser interferometers have associated counters 97 which record table movement information which is sent to system controller 99 which includes, for example, a IBM Model 360/30 computer. Control system 99 directs motors 78, 79, 80 and 81 through coarse or fine motor selector 101 to move the table the desired distance in the X and Y directions. The interferometer and motor control system arrangement is conventional and is described in more detail, for example, in U.S. Pat. No. 4,052,603 whose teachings are incorporated by reference. System controller 99 directs the X-Y table to move alignment targets 67 and 67' to a position such that they are within the field of the alignment illumination spots. The alignment targets 67 and 67' include line edges which are conveniently etched into the wafer, with at least one edge being provided at each target for both the X and Y orthogonal directions. The corresponding alignment targets pattern 57 and 57', each having at least one line edge in the X and Y directions, are located on mask 59. There are many suitable pattern configurations. An example is illustrated in FIGS. 4a and 4b where FIG. 4a illustrates a wafer alignment pattern having pairs of a parallel line edges in the X and Y directions and FIG. 4b represents a suitable mask alignment target having a pair of opaque squares formed, for example, of the opaque mask pattern material such as chromium. The diffraction patterns formed by the corresponding line edges of mask targets 57 and 57' and the aerial image of line edges of targets 67 and 67', which are imaged by lens 60 in the plane of mask 59, are relayed to diode array 103 of sensor 20 by beam splitters 54 and 55, lenses 102 (for example 55 millimeter Nikon photographic lenses), mirror system 104 and lens 105 (for example a 3.2X Leitz microscope objective lens) to diode array 103 of sensor 20 which can be a solid state line scanner sold by Reticon Corporation as Model RL-256DA which has 256 silicon photodiodes mounted on 1 mil centers. Either the diffraction patterns or the diode array can be rotated 90° as known in the art in order to sense the pattern produced by either the X or the Y direction line edges. Alternatively, a pair of arrays can be employed which are oriented in the X and Y orthogonal directions. The associated control means 33 is as described in the embodiment of FIG. 1 except that the computer is illustrated as being part of the over-all system controller 99 in this embodiment. The edge separation of corresponding line edges is determined from the location of the diffraction pattern minima as sensed by the diode array 103. System controller 99 then directs the movement of mask 59 and wafer 69 to adjust the edge separation between corresponding target etch line edge pairs and thereby bring the patterns on the mask and wafer into proper alignment for exposure of the resist. Exposure is accomplished by closing shutters 106 and opening shutter 108 so that mercury light source 63 illuminates the mask pattern which is imaged by lens 60 onto the surface of the photoresist covered wafer to patternwise expose the resist. The resist is then developed to form the relief pattern of resist on the wafer.

Figure 5A:
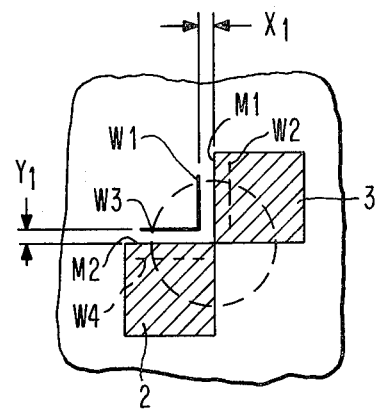
FIG. 5a–5c illustrate alignment targets positioned to measure the relative positions of the mask and wafer in an alignment sequence.
Figure 5B:
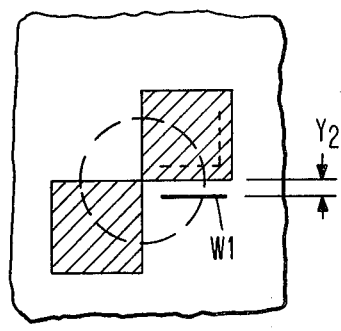
Figure 5C:
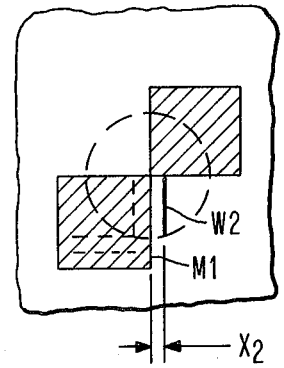

In operation, the mask and wafer are respectively provided with alignment target patterns 67 and 67' as illustrated in FIG. 4a and alignment target patterns 57 and 57' as illustrated in FIG. 4b with the mask 59 and the wafer 69 positioned in the mask holder and on the X-Y table as illustrated on FIG. 3. The following alignment procedure is then carried out as illustrated in FIGS. 5a, 5b and 5c. The X-Y table is moved from the reference (0,0) position a predetermined amount to place the wafer alignment targets within the illumination spots of the alignment system and the mask is adjusted so that the edge to edge gaps are at nominal values for alignment. The table position in X and Y is recorded using the interferometer system. The left hand shutter 106 is placed so as to shut off the beam of illumination to the left hand alignment targets and the right hand shutter is opened so that the alignment beam illuminates the right hand alignment targets. The right hand set of alignment targets are then in the position as shown in FIG. 5a where the illumination spot is the dotted circle and wafer edge images $W_2$ and $W_4$ are shown as dotted lines because they are obscured by the opaque squares 2 and 3 on the mask target. The edge gap ($X_1$) between the wafer edge image $W_1$ and the mask edge $M_1$ is then determined and recorded by the system from the location of diffraction pattern minima. Similarly, the edge gap ($Y_1$) between the wafer edge image $W_3$ and the mask edge $M_2$ is determined and recorded by the system from location of the diffraction pattern minima. The X-Y table is then moved a predetermined distance in X to the right and its position recorded by the laser interferometer system so that the alignment targets are in the position shown in FIG. 5b. The edge gap ($Y_2$) between wafer edge image $W_4$ and mask edge $M_2$ is then determined and recorded from the location of diffraction pattern minima.

The aligned position of the targets in the Y direction occurs when $Y_1$ and $Y_2$ are equal. Therefore, the correct gap on each side of edge $M_2$ is equal to $Y_1$ plus $Y_2$ as measured divided by 2. The difference between the actual gap measurements and the correct gap are now known and the correct table position for Y alignment at the right hand target is calculated. The table is then moved in X and Y a preselected distance down and to the left so that the alignment targets are in the position as shown in FIG. 5c and the table position is recorded by the laser interferometer system. The edge gap $X_2$ between the wafer edge image $W_2$ and mask edge $M_1$ is determined and recorded from the location of the diffraction pattern minima. Assuming that the target is aligned in X when $X_1$ and $X_2$ are equal, the correct gap is equal to $X_1$ plus $Y_1$ as measured, divided by 2 assuming that the table was returned to the original X position as shown in FIG. 5a, if not then the values are adjusted for the X position offset as measured by the interferometer system. The difference between the measured gaps and the correct gap is now known and the correct table position for X alignment of the right hand targets is calculated. the calculated values for X and Y alignment, designated $X_R$ and $Y_R$ on the right hand side are now known. By choosing the gaps to be 200μ in when the targets are aligned and placing the right and left hand targets on the mask 2 inches apart, then the largest $\theta$ misalignment to be corrected is (200 μ in)/1 in = $2 \times 10^{-4}$ rad. With this maximum error the process for achieving rotational alignment is as follows: The X-Y table is moved to place the center of the right hand targets at $X_R$, $Y_R$, i.e., $\beta Y_R = \beta X_R = 0$. The shutters 106 are then moved so that the beam to the right side targets is blocked and the beam to the left hand side targets is opened. The difference $\Delta Y_L$ between the gaps in the Y direction of the left hand set of targets is then determined by the diffraction pattern analysis system using the same steps employed to determine the Y gaps at the right hand side as described above and in FIGS. 5a and 5b.

Then the measured difference $\Delta Y_L$ = a quantity $(\Delta Y_L)°$. To correct the misalignment requires a move of $(\Delta Y_L)°/2$ with the right hand targets centered at $\Delta Y_R = \Delta Y_R = 0$. This is done half by rotation and half by translation as follows. Rotate the mask $$\theta = \frac{(\Delta Y_L)°/4}{d/2} = \frac{(\Delta Y_L)°}{2d},$$

where d is the distance between the alignment targets which brings $\Delta Y_L$ half way to zero, i.e., to $(\Delta Y_L)°/2$ but this also changes $\Delta Y_R$ from zero to $\theta \times d = (\Delta Y_L)°/2$ so that both the left and right sides are displaced by $(\Delta Y_L)°/2$ in the same direction. Alignment is achieved by moving the X-Y table this amount in Y. With the small angle of rotation needed, a correction in the X direction at the left side due to the rotation of the mask is not necessary when $\Delta X_R$ has already been set $=0$.

Many alternative patterns and procedures could be used to determine alignment. For example in the embodiment shown, the spacing of the target lines on the wafer could be first measured by diffraction pattern analysis so that, after the measurements in FIG. 5a were made, the offset from a centered position of the mask lines would be the difference between the edge gap measurements and ½ of the determined distance between the wafer target lines.

The axis for mask rotation need not pass through the center line between targets but could be elsewhere so long as its position is known so that the alignment algorithm can be suitably adjusted for the location of the pivot point. This is also not necessary if a continuous monitoring approach is used with switching back and forth between the left and right side targets. Either of the objects can be moved to achieve alignment. Where lens 60 is a reduction lens, then positional errors with respect to the mask, which has the larger patterns, are less important and it requires a less accurate measurement system if the mask rather than the wafer is moved to achieve alignment.

It should be understood that the invention is not limited to alignment of objects but can be used to determine the offset of any line edges on two objects. For example, the overlay of patterns on two objects can be determined by measuring the offsets at different locations on the patterns. This is required where a series of pattern masks used for different levels of integrated circuit manufacture are generated by step and repeat exposure using single segments. If the locations of the single segment patterns vary from mask to mask then, even if the masks are properly aligned, the patterns within the mask may not be aligned with preexisting patterns on a wafer to the necessary tolerances to produce a good integrated circuit when the wafers are processed. Mask sets, therefore, can be checked for proper overlay with the system of the invention to be sure that they will produce an acceptable yield of good integrated circuit chips.

The production of the image of the wafer pattern at the mask can be produced by reflective as well as refractive optics. Where two transparent objects such as masks are involved, then the detection can be located behind the second object with the diffraction pattern formed by an in line imaging of the edge located on the first object at the plane of the second object.

While the invention has been particularly shown and described with reference to a preferred embodiments thereof, it will be understood by those skilled in the art that various changes in form and details may be made therein without departing from the spirit and scope of the invention.

What is claimed is:

1. A system for measuring the lateral displacement between edges located on two spaced apart objects comprising:

means to illuminate said edges with collimated, monochromatic, spatially coherent radiation;

means to form the focussed aerial image of a first edge which is located on one of said objects at the plane of a second edge which is located on the other of said objects so as to produce a diffraction pattern from the interference of the second edge and the aerial image of the first edge;

means for sensing the light intensity of different points in said diffraction pattern and for determining the locations of the diffraction pattern minima, and;

means for determining the lateral displacement between said first and second edges from the distance between the diffraction pattern minima.

2. The system of claim 1 wherein the means to illuminate said edges is a laser, the first edge is located on an opaque object and the second edge is located on a transparent object; the means to form the focussed aerial image is a lens located between the objects and the aerial image of the first edge is formed by reflection of radiation from the opaque object.

3. A system for aligning two spaced apart objects by measuring the lateral displacement between edges located on said objects comprising:

means for placing and holding said objects in approximate alignment, said means including indexing means for changing the relative position of said objects, means to illuminate said edges with collimated, monochromatic, spatially coherent radiation;

means to form the focussed aerial image of a first edge which is located on one of said objects at the plane of a second edge which is located on the other of said objects so as to produce a diffraction pattern from the interference of the second edge and the aerial image of the first edge;

means for sensing the light intensity at different points in said diffraction pattern and for determining the locations of the diffraction pattern minima, and control means for determining the lateral displacement between said first and second edges from the distance between the diffraction pattern minima, for computing the relative position of said objects from said displacement, and for directing said indexing means to move said objects into alignment.

4. A system for aligning first and second objects, comprising:

(a) two spaced apart alignment targets located on the first object, each target including at least one edge in the X and one edge in the Y orthogonal directions, (b) two spaced apart alignment targets located on the second object which correspond to the targets on said first object each taget including at least one edge in the X and one edge in the Y orthogonal directions, (c) means for placing and holding said first and second objects in approximate alignment said means including indexing means for changing the relative position of said first and second objects in the X, Y and angular directions, (d) means to illuminate said targets with collimated, monochromatic, spatially coherent radiation, (e) means to form the focussed aerial image of the targets on said first object at the plane of the targets on said second object, (f) means to produce diffraction patterns from the interference between corresponding edges of targets on said first object and the aerial images of the edges of the targets on said second object, (g) means to image the diffraction patterns to means for sensing the light intensity at different points in said diffraction patterns and for determining the location of the diffraction pattern minima; and (h) control means for computing the lateral displacements between corresponding edges of targets on said first and second objects from the diffraction pattern minima and for computing the relative position of said first and second objects from said lateral displacements and for directing said indexing means to move said first and second objects into alignment.

5. A system for aligning a pattern mask with a pattern on a semiconductor wafer which is coated with a radiation sensitive resist material, comprising:
(a) two spaced apart alignment targets located on said mask, each target including at least one edge in the X and one edge in the Y orthogonal directions,
(b) two spaced apart alignment targets located on said wafer which correspond to the targets on said mask each target including at least one edge in the X and one edge in the Y orthogonal directions,
(c) means for placing and holding said mask and wafer in approximate alignment said means including indexing means for changing the relative position of said mask and wafer in the X, Y and angular directions,
(d) means to illuminate said targets with collimated, monochromatic, spatially coherent radiation,
(e) means to form the focussed aerial image of the targets on the wafer at the plane of the targets on the mask,
(f) means to produce diffraction patterns from the interference between corresponding edges of targets on said mask and the aerial images of the edges of the targets on the wafer,
(g) means to image the diffraction patterns to means for sensing the light intensity at different points in said diffraction patterns and for determining the location of the diffraction pattern minima; and
(h) control means for computing the lateral displacements between corresponding edges of targets on the mask and wafer from the diffraction pattern minima and for computing the relative position of the mask and wafer from said lateral displacements and for directing said indexing means to move the mask and wafer, into alignment.

6. The system of claim 5 wherein said means to illuminate said targets includes a laser.

7. The system of claim 5 wherein said means to form the focussed aerial image of the targets is a projection printing lens.

8. The system of claim 5 wherein said means for sensing the light intensity includes a diode array.

9. The system of claim 5 including means to illuminate the pattern mask so as to expose the resist material.

10. A process for measuring the lateral displacement between edges located on two spaced apart objects comprising:
illuminating said edges with collimated, monochromatic, spatially coherent radiation;
forming the focussed aerial image of a first edge which is located on one of said objects at the plane of a second edge which is located on the other of said objects so as to produce a diffraction pattern from the interference of the second edge and the aerial image of the first edge;
sensing the light intensity at different points in the diffraction pattern and determining the locations of the diffraction pattern minima, and;
determining the lateral displacement between said first and second edges from the distance between the diffraction pattern minima.

11. A process for aligning first and second objects, comprising:
(a) providing two spaced apart alignment targets on the first object, each target including at least one edge in the X and one edge in the Y orthogonal directions,
(b) providing two spaced apart alignment targets on the second object which correspond to the targets on said first object each target including at least one edge in the X and one edge in the Y orthogonal directions,
(c) placing and holding the first and second objects in approximate alignment,
(d) illuminating said targets with collimated, monochromatic, spatially coherent radiation,
(e) forming the focussed aerial image of the targets on said first object at the plane of the targets on said second object so as to produce diffraction patterns from the interference between corresponding edges of targets on said first object and the aerial images of the edges of the targets on said second object,
(f) sensing the light intensity at different points in said diffraction patterns and determining the location of the diffraction pattern minima; and
(g) computing the lateral displacements between corresponding edges of targets on said first and second objects from the diffraction pattern minima and computing the relative position of said first and second objects from said lateral displacements; and
(h) moving said first and second objects into alignment.

12. A system for comparing the overlay between patterns located on two spaced apart objects comprising:
means to illuminate said patterns with collimated, monochromatic, spatially coherent radiation;
means to form the focussed aerial image of a first pattern edge which is located on one of said objects at the plane of a second pattern edge which is located on the other of said objects so as to produce a diffraction pattern from the interference of the second pattern edge and the aerial image of the first pattern edge;
means for sensing the light intensity of different points in said diffraction pattern and for determining the locations of the diffraction pattern minima, and;
means for comparing the overlay between said first and second pattern edges from the distance between the diffraction pattern minima.

13. A process for comparing overlay between patterns located on two spaced apart objects comprising:
illuminating said patterns with collimated, monochromatic, spatially coherent radiation;
forming the focussed aerial image of a first pattern edge which is located on one of said objects at the plane of a second pattern edge which is located on the other of said objects so as to produce a diffraction pattern from the interference of the second pattern edge and the aerial image of the first pattern edge;
sensing the light intensity at different points in the diffraction pattern and determining the locations of the diffraction pattern minima, and;
comparing the overlay between said first and second pattern edges from the distance between the diffraction pattern minima.

* * * * *